(12) United States Patent
Heo et al.

(10) Patent No.: US 11,721,669 B2
(45) Date of Patent: Aug. 8, 2023

(54) SEMICONDUCTOR PACKAGE INCLUDING A FIRST SEMICONDUCTOR STACK AND A SECOND SEMICONDUCTOR STACK OF DIFFERENT WIDTHS

(71) Applicant: SAMSUNG ELECTRONICS CO., LTD., Suwon-si (KR)

(72) Inventors: Junyeong Heo, Suwon-si (KR); Jae-Eun Lee, Suwon-si (KR); Yeongkwon Ko, Suwon-si (KR); Donghoon Won, Cheonan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 300 days.

(21) Appl. No.: 16/877,169

(22) Filed: May 18, 2020

(65) Prior Publication Data
US 2021/0091045 A1 Mar. 25, 2021

(30) Foreign Application Priority Data
Sep. 24, 2019 (KR) .......................... 10-2019-0117470

(51) Int. Cl.
*H01L 25/065* (2023.01)
*H01L 23/31* (2006.01)
*H01L 23/00* (2006.01)

(52) U.S. Cl.
CPC ...... *H01L 25/0657* (2013.01); *H01L 23/3142* (2013.01); *H01L 24/29* (2013.01); *H01L 2224/94* (2013.01)

(58) Field of Classification Search
CPC ....... H01L 23/525; H01L 23/48; H01L 23/04; H01L 25/065; H01L 25/0657;
(Continued)

(56) References Cited

U.S. PATENT DOCUMENTS 7,560,821 B2  7/2009  Osuga et al.
9,343,433 B2  5/2016  Lee et al.
(Continued)

FOREIGN PATENT DOCUMENTS

JP         6122863    4/2017
JP      2019057741    4/2019
(Continued)

*Primary Examiner* — Younes Boulghassoul
*Assistant Examiner* — Quinton A Brasfield
(74) *Attorney, Agent, or Firm* — F. Chau & Associates, LLC

(57) ABSTRACT

A semiconductor package is provided including a first semiconductor chip stack and a second semiconductor chip stack that are adjacent to each other. The first semiconductor chip stack includes a plurality of first semiconductor chips and a plurality of first adhesive layers. The second semiconductor chip stack includes a plurality of second semiconductor chips and a plurality of second adhesive layers. Each of the first semiconductor chips includes a first cell region and a first scribe lane that surrounds the first cell region. Each of the second semiconductor chips includes a second cell region and a second scribe lane that surrounds the second cell region. An area of the first scribe lane is greater than an area of the second scribe lane. The plurality of first adhesive layers and the plurality of second adhesive layers have the same coefficient of thermal expansion.

17 Claims, 12 Drawing Sheets

(58) Field of Classification Search
CPC . H01L 2224/73204; H01L 2225/06541; H01L 2221/68327; H01L 25/074; H01L 2225/06568; H01L 2225/06555; H01L 21/8221; H01L 23/49827; H01L 23/481; H01L 23/5384; H01L 2223/5446; H01L 2223/54453; H01L 23/554; H01L 21/3043
See application file for complete search history.

(56) References Cited

U.S. PATENT DOCUMENTS

| | | | |
|---|---|---|---|
| 9,362,262 B2 | 6/2016 | Yamamichi et al. | |
| 9,397,678 B2 | 7/2016 | Chandow et al. | |
| 10,083,939 B2* | 9/2018 | Seo | H01L 23/3185 |
| 10,170,389 B2 | 6/2019 | Groothuis et al. | |
| 2004/0222508 A1 | 11/2004 | Aoyagi | |
| 2010/0171203 A1* | 7/2010 | Chen | H01L 23/585 |
| | | | 257/773 |
| 2011/0057327 A1* | 3/2011 | Yoshida | H01L 23/544 |
| | | | 257/777 |
| 2011/0127652 A1* | 6/2011 | Bonkohara | H01L 25/50 |
| | | | 257/659 |
| 2012/0088332 A1* | 4/2012 | Lee | H01L 25/50 |
| | | | 257/E21.499 |
| 2013/0009308 A1* | 1/2013 | Kwon | H01L 23/49827 |
| | | | 257/E23.068 |
| 2013/0021442 A1 | 8/2013 | Kakanoya | |
| 2014/0284780 A1* | 9/2014 | Kinoshita | H01L 23/481 |
| | | | 257/676 |
| 2015/0162265 A1* | 6/2015 | Jo | H01L 25/50 |
| | | | 257/774 |
| 2016/0141273 A1 | 5/2016 | Tsuji | |
| 2018/0006006 A1* | 1/2018 | Kim | H01L 24/33 |
| 2018/0337065 A1 | 11/2018 | Lin et al. | |
| 2019/0206841 A1* | 7/2019 | Kim | H01L 25/0657 |
| 2020/0020641 A1* | 1/2020 | Ko | H01L 21/78 |
| 2020/0135698 A1* | 4/2020 | Hong | H01L 21/6836 |

FOREIGN PATENT DOCUMENTS

| | | |
|---|---|---|
| KR | 101348330 | 1/2014 |
| KR | 10-2018-0131220 | * 10/2018 |
| KR | 10-2018-0131220 | * 12/2018 |

* cited by examiner

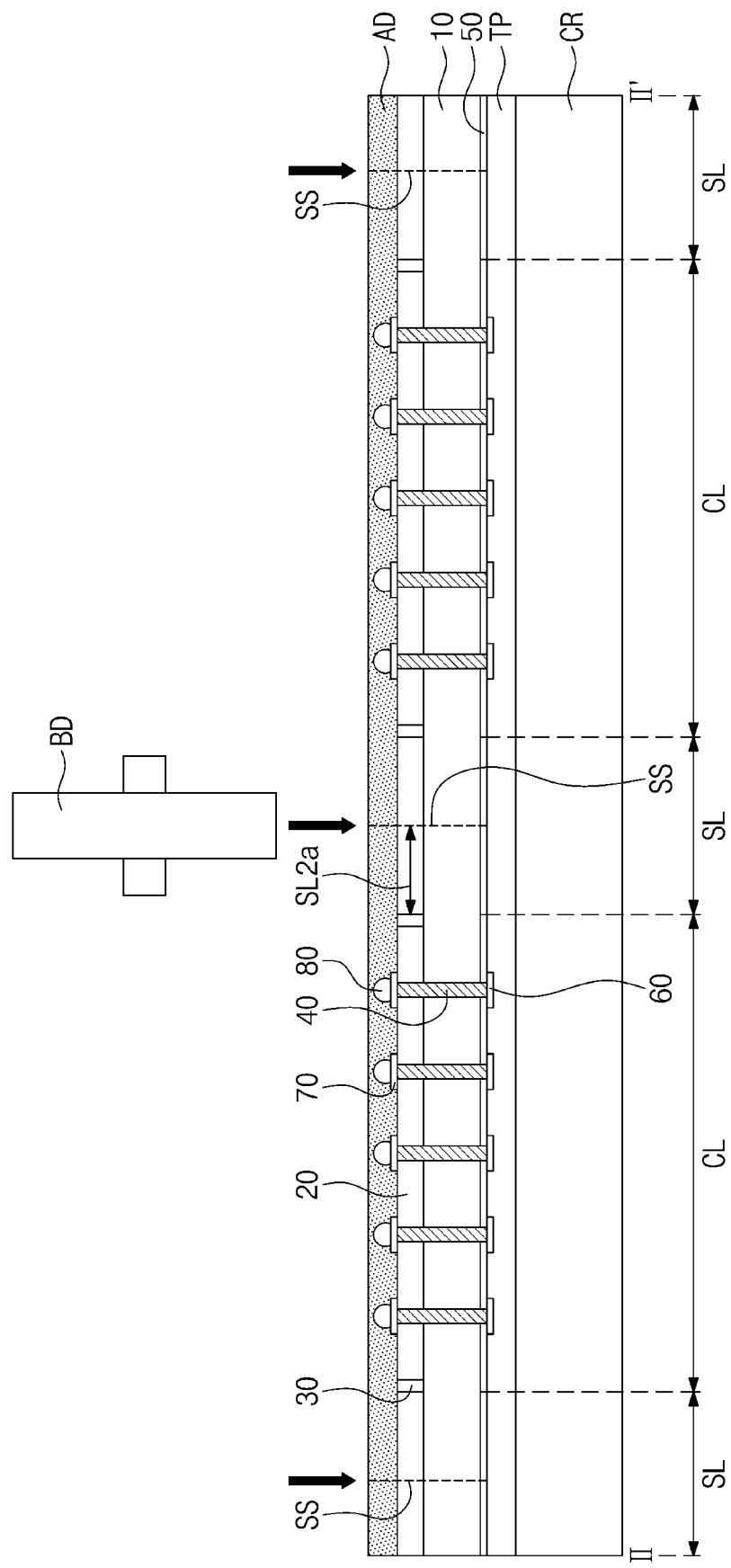

SEMICONDUCTOR PACKAGE INCLUDING A FIRST SEMICONDUCTOR STACK AND A SECOND SEMICONDUCTOR STACK OF DIFFERENT WIDTHS

CROSS-REFERENCE TO RELATED APPLICATION

This U.S. non-provisional patent application claims priority under 35 U.S.C. § 119 to Korean Patent Application No. 10-2019-0117470 filed on Sep. 24, 2019, in the Korean Intellectual Property Office, the disclosure of which is incorporated by reference herein in its entirety.

TECHNICAL FIELD

The present inventive concept relates to a semiconductor package, and more particularly, to a semiconductor package including a first semiconductor stack and a second semiconductor stack of different widths.

DISCUSSION OF THE RELATED ART

In response to the rapid development of the electronic industry and users' demands for versatility, electronic products have become smaller and increasingly multifunctional. Concomitantly, there is an increased need for miniaturization and multi-functionality of semiconductor devices used for such electronic products. Accordingly, a semiconductor package has been suggested in which a plurality of semiconductor chips are vertically stacked including through substrate vias.

SUMMARY

According to an exemplary embodiment of the present inventive concept, a semiconductor package is provided including a first semiconductor chip stack and a second semiconductor chip stack that are adjacent to each other. The first semiconductor chip stack includes a plurality of first semiconductor chips and a plurality of first adhesive layers. The second semiconductor chip stack includes a plurality of second semiconductor chips and a plurality of second adhesive layers. Each of the first semiconductor chips includes a first cell region and a first scribe lane that surrounds the first cell region. Each of the second semiconductor chips includes a second cell region and a second scribe lane that surrounds the second cell region. An area of the first scribe lane is greater than an area of the second scribe lane. The plurality of first adhesive layers and the plurality of second adhesive layers have the same coefficient of thermal expansion.

According to an exemplary embodiment of the present inventive concept, a semiconductor package is provided including a base chip. A first semiconductor chip stack and a second semiconductor chip stack are stacked in a vertical direction on the base chip. A molding member at least partially covers the base chip, the first semiconductor chip stack, and the second semiconductor chip stack. The first semiconductor chip stack includes a plurality of first semiconductor chips that are stacked in the vertical direction and a plurality of first adhesive layers disposed on a bottom surface of each of the first semiconductor chips. The second semiconductor chip stack includes a plurality of second semiconductor chips that are stacked in the vertical direction and a plurality of second adhesive layers disposed on the bottom surface of each of the second semiconductor chips. Each of the first semiconductor chips and each of the second semiconductor chips has a width in a first direction. The width in the first direction of each of the first semiconductor chips is greater than the width in the first direction of each of the second semiconductor chips. The first semiconductor chip includes an amorphous semiconductor material that is formed on a lateral surface of the first semiconductor chip. A surface roughness on a lateral surface of each of the second semiconductor chips is greater than a surface roughness on the lateral surface of each of the first semiconductor chips. The plurality of first adhesive layers and the plurality of second adhesive layers include the same adhesive material.

According to an exemplary embodiment of the present inventive concept, a semiconductor package includes a base chip. A first semiconductor chip stack is disposed on the base chip. A second semiconductor chip stack is disposed on the first semiconductor chip stack. A molding member at least partially covers the base chip, the first semiconductor chip stack, and the second semiconductor chip stack. The first semiconductor chip stack includes a plurality of first semiconductor chips that are stacked in a vertical direction and a plurality of first adhesive layers disposed on a bottom surface of each of the first semiconductor chips. The second semiconductor chip stack includes a plurality of second semiconductor chips that are stacked in the vertical direction and a plurality of second adhesive layers disposed on a bottom surface of each of the second semiconductor chips. The plurality of first adhesive layers and the plurality of second adhesive layers have the same coefficient of thermal expansion. Each of the first semiconductor chips and each of the second semiconductor chips includes a through via. Each of the first semiconductor chips and each of the second semiconductor chips has a width in a first direction parallel to a top surface of the base chip. The width in the first direction of each of the first semiconductor chips is greater than the width in the first direction of each of the second semiconductor chips. Each of the first semiconductor chips includes a first cell region and a first scribe lane that surrounds the first cell region. Each of the second semiconductor chips includes a second cell region and a second scribe lane that surrounds the second cell region. An area of the first scribe lane is greater than an area of the second scribe lane.

BRIEF DESCRIPTION OF THE DRAWINGS

FIGS. 6A and 6B are cross-sectional views illustrating steps in a method of fabricating a second semiconductor chip according to an exemplary embodiment of the present inventive concept.

DETAILED DESCRIPTION OF EMBODIMENTS

Figure 1A:
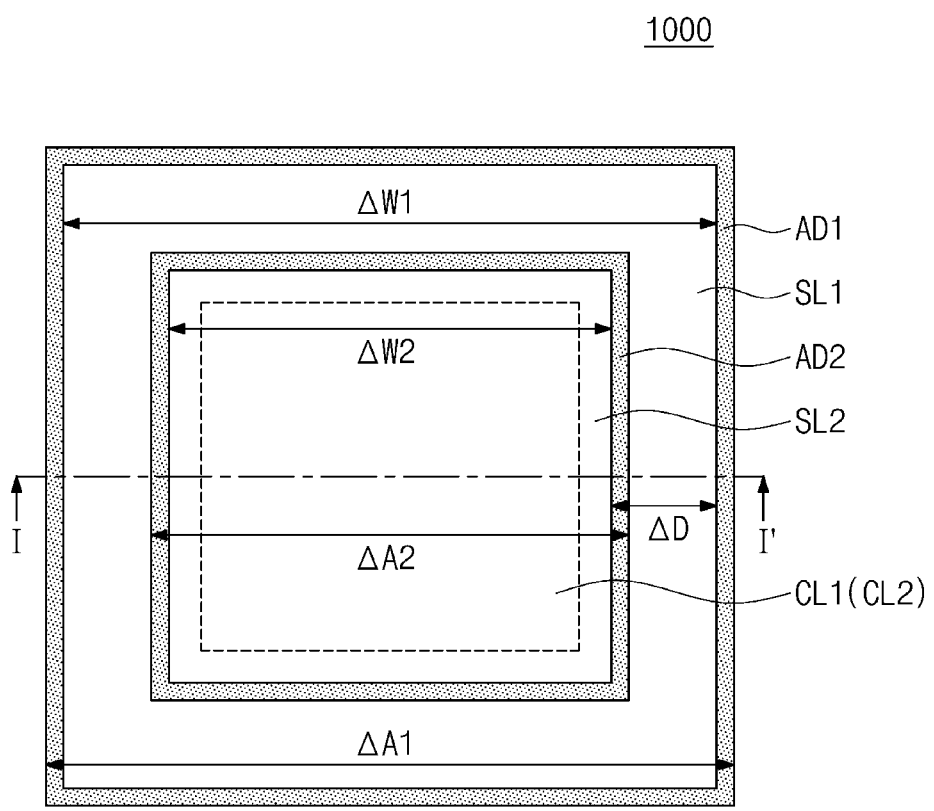
FIG. 1A is a plan view illustrating a semiconductor package according to an exemplary embodiment of the present inventive concept.

Hereinafter, exemplary embodiments of the present inventive concept will be described in detail with reference to the accompanying drawings. Like reference numerals may refer to like elements throughout the specification and the drawings.

Figure 1B:
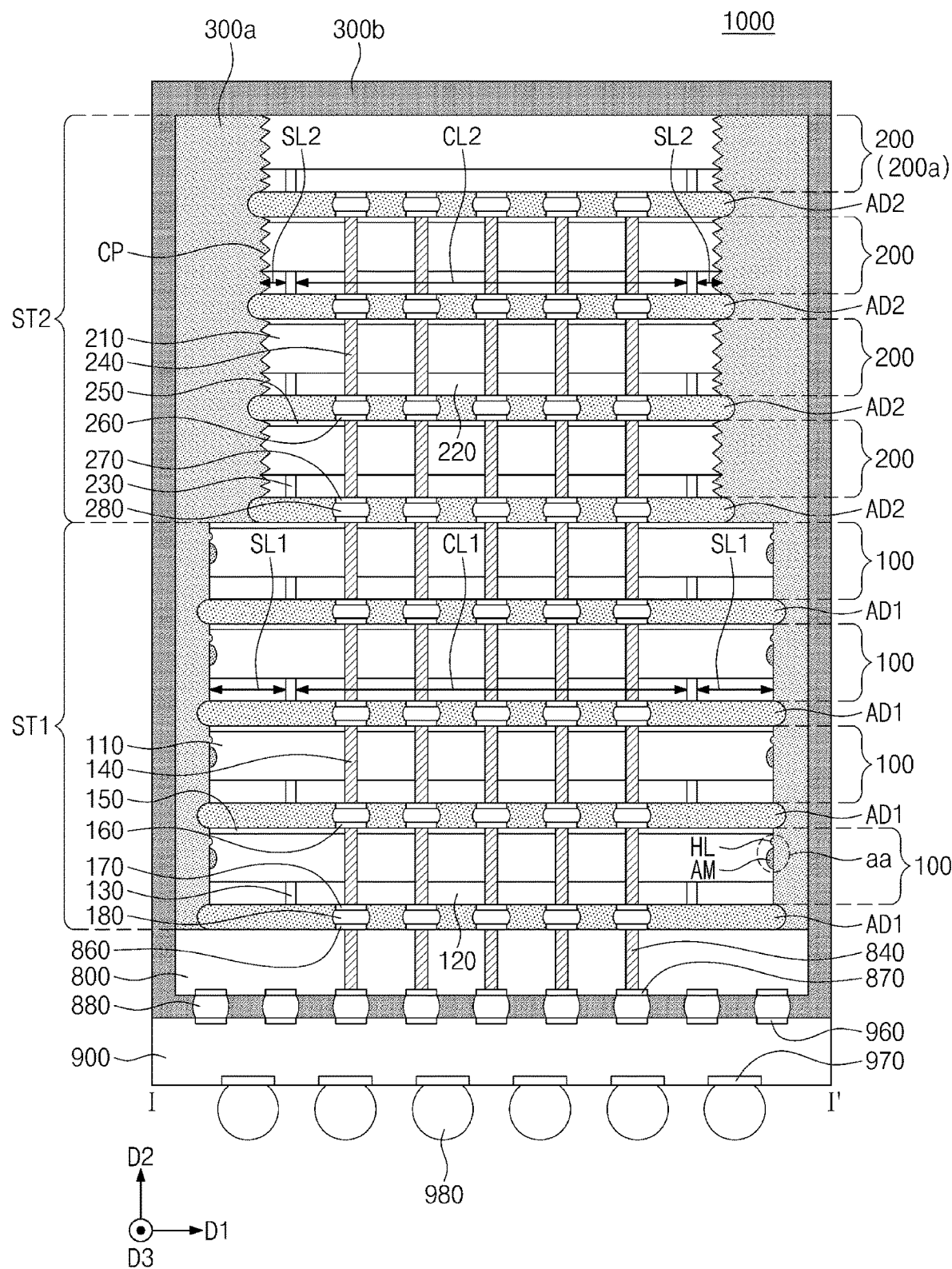
FIG. 1B is a cross-sectional view illustrating a cross-section taken along line I-I' of FIG. 1A according to an exemplary embodiment of the present inventive concept.

FIG. 1A is a plan view illustrating a semiconductor package 1000 according to an exemplary embodiment of the present inventive concept. FIG. 1B is a cross-sectional view illustrating a cross-section taken along line of FIG. 1A according to an exemplary embodiment of the present inventive concept. For clarity of illustration, FIG. 1A omits some components shown in FIG. 1B.

Referring to FIGS. 1A and 1B, the semiconductor package 1000 may include a base chip 800, a first semiconductor chip stack ST1, a second semiconductor chip stack ST2, and a first molding member 300a.

The base chip 800 may be provided on the package substrate 900. The first semiconductor chip stack ST1 and the second semiconductor chip stack ST2 are stacked in a vertical direction (e.g., a second direction D2) on a top surface of the base chip 800. For example, the first semiconductor chip stack ST1 and the second semiconductor chip stack ST2 are sequentially stacked on the base chip 800. The first semiconductor chip stack ST1 and the second semiconductor chip stack ST2 may each include at least one first semiconductor chip 100 and at least one second semiconductor chip 200, respectively. The first molding member 300a may cover the top surface of the base chip 800. For example, the first molding member 300a may cover edges of the top surface of the base chip 800.

The first molding member 300a may cover a lateral surface of the first semiconductor chip stack ST1 and may extend to partially cover a top surface of the first semiconductor chip stack ST1. For example, the first molding member 300a may cover opposite edges of a top surface of the first semiconductor chip stack ST1 spaced apart in the first direction (e.g., the D1 direction). The first molding member 300a may cover a lateral surface of the second semiconductor chip stack ST2 with a complementary shape thereto. The first semiconductor chip stack ST1 may be wider in the first direction (e.g., the D1 direction) and/or a third direction (e.g., a D3 direction) relative to a width of the second semiconductor chip stack ST2. The portion of the first semiconductor chip stack ST1 that exceeds the width of the second semiconductor chip stack ST2 may have an upper surface and a lateral surface covered by the first molding member 300a. In an exemplary embodiment of the present inventive concept, the first molding member 300a may cover a top surface and lateral surfaces of the second semiconductor chip stack ST2. The first molding member 300a may include, for example, an epoxy compound. Each of the first semiconductor chips 100 and each of the second semiconductor chips 200 may be a memory chip, and the first semiconductor chips 100 and the second semiconductor chips 200 may include the same circuit device. The base chip 800 may be, for example, a logic chip. The logic chip may be one of a graphic processing unit (GPU), a system-on-chip (SOC), and the like. The base chip 800 may include one or more through electrodes 840 that vertically (e.g., the D2 direction) penetrate the base chip 800. Pads 860 and 870 may be respectively disposed at a top surface and a bottom surface of the base chip 800. The through electrodes 840 may be electrically connected to the pads 860 and 870. Bumps 880 may be provided on corresponding pads 870 at the bottom of the base chip 800. The base chip 800 may be electrically connected through the bumps 880 to a package substrate 900 which will be discussed below.

The first semiconductor chip stack ST1 may include a plurality of first semiconductor chips 100 and a plurality of first adhesive layers AD1 disposed between neighboring first semiconductor chips 100 in the vertical direction (e.g., the D2 direction).

Each of the first semiconductor chips 100 may include a first semiconductor substrate 110, a plurality of first through electrodes 140, a first dielectric layer 150, a plurality of first upper connection pads 160, a plurality of first lower connection pads 170, and a plurality of first connection bumps 180.

The first semiconductor substrate 110 may have top and bottom surfaces opposite to each other, and a top surface of a first semiconductor substrate 110 may face a bottom surface of a second semiconductor substrate 110 stacked thereon. The first semiconductor substrate 110 may include, for example, silicon. The first semiconductor chips 100 may include an amorphous semiconductor material (e.g., amorphous silicon) that is locally formed on a lateral surface of the first semiconductor chips 100. The first semiconductor substrate 110 may include an amorphous region AM and/or a concave portion HL on opposite lateral surfaces thereof. The amorphous region AM and/or the concave portion HL may be formed by a stealth sawing method which will be discussed below. A description will be made below of the formation of the amorphous region AM and/or the concave portion HL on the lateral surface of the first semiconductor substrate 110. A central portion of a lateral surface of the first semiconductor chips 100 have a dislocation density that is greater than a dislocation density at an edge of the lateral surface of the first semiconductor chips 100.

The first dielectric layer 150 may be provided on the top surface of the first semiconductor substrate 110.

Each of the first through electrodes 140 may penetrate the first semiconductor substrate 110 and the first circuit layer 120. The first through electrodes 140 may extend from a top surface of the first dielectric layer 150 toward the bottom surface of the first semiconductor substrate 110. The first through electrodes 140 may be aligned in the vertical direction (e.g., the D2 direction).

The first through electrodes 140 may be electrically connected to corresponding first upper connection pads 160 and corresponding first lower connection pads 170. The first upper connection pads 160 may be provided on the first dielectric layer 150, and the first lower connection pads 170 may be provided on the bottom surface of the first semiconductor substrate 110.

The first connection bumps 180 may be provided on corresponding first lower connection pads 170.

The first semiconductor substrate 110 may include a first cell region CL1 and a first scribe lane SL1. When viewed in a plan view, the first scribe lane SL1 may surround the first cell region CL1. For example, the first scribe lane SL1 may have a rectangular annulus shape. The first cell region CL1 may be an area where semiconductor devices are disposed.

The first semiconductor substrates 110 may include a first circuit layer 120 at a bottom thereof. The first circuit layer 120 may be disposed on the first cell region CL1. The first circuit layer 120 may include an integrated circuit (e.g., memory circuit).

A first protective ring 130 may be provided in the vicinity of an edge of the first circuit layer 120. The first protective ring 130 may be disposed at a boundary between the first cell region CL1 and the first scribe lane SL1. The first protective ring 130 may include a metallic material, a dielectric material, and/or a doped semiconductor material. As discussed below, the first protective ring 130 may protect individual devices from external contamination in a sawing process in which the first semiconductor chip 100 is fabricated.

The second semiconductor chip stack ST2 may include a plurality of second semiconductor chips 200 and a plurality of second adhesive layers AD2 between at least one pair of neighboring second semiconductor chips 200.

Each of the second semiconductor chips 200 may include a second semiconductor substrate 210, a plurality of second through electrodes 240, a second dielectric layer 250, a plurality of second upper connection pads 260, a plurality of second lower connection pads 270, and a plurality of second connection bumps 280.

The second semiconductor substrate 210 may have a top surface and a bottom surface that face each other (e.g., are opposite to one another). The second semiconductor substrate 210 may include, for example, silicon.

The second semiconductor substrate 210 may include a chipping region CP on at least a portion of opposite lateral surfaces of the second semiconductor substrate 210. The second semiconductor substrate 210 may have a dislocation density that is higher on an upper portion and a lower portion of the lateral surface thereof than on a central portion of the lateral surface thereof. The difference in dislocation density may be caused by that the second semiconductor substrate 210 has a greater pressure on upper portions and lower portions thereof than on other portions in a blade sawing process which will be discussed below. Each of the upper portions and the lower portions of a lateral surface of the first semiconductor chips 100 have a dislocation density greater than a dislocation density at a central portion of a lateral surface of the second semiconductors chips 200.

The second semiconductor substrate 210 may include a second cell region CL2 and a second scribe lane SL2. When viewed in a plan view, the second scribe lane SL2 may surround the second cell region CL2. For example, the second scribe lane SL2 may have a rectangular annulus shape. The second cell region CL2 may be an area where semiconductor devices are disposed. The semiconductor devices disposed on the second cell region CL2 may be substantially the same as those disposed on the first cell region CL1.

The second semiconductor substrate 210 may include a second circuit layer 220 at bottom thereof. The second circuit layer 220 may be disposed on the second cell region CL2. The second circuit layer 220 may be substantially the same as the first circuit layer 120.

A second protective ring 230 may be provided in the vicinity of an edge of the second circuit layer 220. The second protective ring 230 may be disposed at a boundary between the second cell region CL2 and the second scribe lane SL2. The second protective ring 230 may be substantially the same as the first protective ring 130. The second protective ring 230 and the first protective ring 130 may be aligned in the vertical direction (e.g., the D2 direction).

The second dielectric layer 250 may be provided on the top surface of the second semiconductor substrate 210. Each of the second through electrodes 240 may penetrate the second semiconductor substrate 210 and may extend from a top surface of the second dielectric layer 250 toward the bottom surface of the second semiconductor substrate 210. The second through electrodes 240 may be electrically connected to corresponding second upper connection pads 260 and corresponding second lower connection pads 270. The second upper connection pads 260 may be provided on the second dielectric layer 250, and the second lower connection pads 270 may be provided on the bottom surface of the second semiconductor substrate 210. The second connection bumps 280 may be provided on corresponding second lower connection pads 270.

A second semiconductor chip 200a positioned as the uppermost second semiconductor chip 200 of the second semiconductor chip stack ST2 may include none of the second through electrode 240, the second dielectric layer 250, and the second upper connection pad 260.

The semiconductor package 1000 may be mounted on a package substrate 900. The package substrate 900 may be, for example, a printed circuit board (PCB). Pads 960 and 970 may be correspondingly disposed at a top surface and a bottom surface of the package substrate 900. Solder balls 980 may be provided on bottom surfaces of the pads 970 on the lower portion of the package substrate 900. The package substrate 900 may be electrically connected through the solder balls 980 to a motherboard which will be attached to the package substrate 900.

A second molding member 300b may be provided to cover the semiconductor package 1000 and a top surface of the package substrate 900. The second molding member 300b may include a material identical to or different from that of the first molding member 300a. The first semiconductor chip 100 may have a width ΔW1 in a first direction (e.g., the D1 direction) and/or the third direction (e.g., the D3 direction) parallel to the top surface of the base chip 800. The second semiconductor chip 200 may have a width ΔW2 in the first direction (e.g., the D1 direction). The width ΔW1 in the first direction (e.g., the D1 direction) and/or the third direction (e.g., the D3 direction) of the first semiconductor chip 100 may be greater than the width ΔW2 in the first direction (e.g., the D1 direction) and/or the third direction (e.g., the D3 direction) of the second semiconductor chip 200.

When viewed in a plan view, the second semiconductor chip 200 may overlap a portion of the first semiconductor chip 100. The first semiconductor chip 100 may have one side that is spaced apart along the first direction (e.g., the D1 direction) or the third direction (e.g., the D3 direction) from an adjacent side of the second semiconductor chip 200. A spacing distance ΔD of 15 μm to 25 μm may be provided between the one side of the first semiconductor chip 100 and the adjacent side of the second semiconductor chip 200. The first semiconductor chip 100 and the second semiconductor chip 200 may be concentrically disposed rectangular shapes such that all four sides of the first semiconductor chip 100 are a spacing distance ΔD from a respective side of the second semiconductor chip 200. However, the present inventive concept is not limited thereto. For example, at least one side of the second semiconductor chip 200 may be aligned with a respective side of the first semiconductor chip 100, and thus less than all four sides of the second semiconductor chip 200 may be spaced by the spacing distance ΔD from an adjacent side of the first semiconductor chip 100.

The first cell region CL1 may vertically overlap the second cell region CL2. For example, the first cell regions CL1 and the second cell regions CL2 may be aligned in the vertical direction (e.g., the D2 direction). The first cell region CL1 may have the same area as that of the second cell region CL2. A semiconductor device on the first cell region CL1 may be the same as a semiconductor device on the second cell region CL2.

When viewed in a plan view, a portion of the first scribe lane SL1 may wholly overlap the second scribe lane SL2. The first scribe lane SL1 may surround the second scribe lane SL2. The first scribe lane SL1 may have an area greater than an area of the second scribe lane SL2.

When viewed in a cross-sectional view, a spacing distance between the first upper connection pad 160 close to an edge of the first semiconductor chip 100 and an adjacent lateral surface of the first semiconductor chip 100 may be greater than a spacing distance between the second upper connection pad 260 close to an edge of the second semiconductor chip 200 and an adjacent lateral surface of the second semiconductor chip 200. Likewise, a spacing distance between the first lower connection pad 170 close to an edge of the first semiconductor chip 100 and an adjacent lateral surface of the first semiconductor chip 100 may be greater than a spacing distance between the second lower connection pad 270 close to an edge of the second semiconductor chip 200 and an adjacent lateral surface of the second semiconductor chip 200.

When viewed in a plan view, a spacing distance between the first protective ring 130 and an adjacent lateral surface of the first semiconductor chip 100 may be greater than a spacing distance between the second protective ring 230 and an adjacent lateral surface of the second semiconductor chip 200.

The lateral surface of the first semiconductor chip 100 may be smoother than the lateral surface of the second semiconductor chip 200. For example, the lateral surface of the first semiconductor chip 100 may have a surface roughness less than that of the lateral surface of the second semiconductor chip 200.

The first adhesive layers AD1 and the second adhesive layers AD2 may include the same adhesive material. The first adhesive layers AD1 and the second adhesive layers AD2 may have the same coefficient of thermal expansion. The first adhesive layer AD1 may have an average thickness substantially the same as that of the second adhesive layer AD2.

The first adhesive layers AD1 and the second adhesive layers AD2 may have widths in the first direction (e.g., the D1 direction) and/or the third direction (e.g., the D3 direction). The first adhesive layer AD1 may have a width ΔA1 in the first direction (e.g., the D1 direction) greater than a width ΔA2 in the first direction (e.g., the D1 direction) of the second adhesive layer AD2. The first adhesive layer AD1 may be provided on a bottom surface of the first semiconductor chip 100. The bottom surface of the first semiconductor chip 100 has an area greater than that of a bottom surface of the second semiconductor chip 200, and thus a total weight of the plurality of first adhesive layers AD1 in the semiconductor package 1000 may be greater than a total weight of the plurality of second adhesive layers AD2 in the semiconductor package 1000.

When the semiconductor package 1000 is mounted on the package substrate 900, the semiconductor package 1000 may warp in a convex shape (so-called smile warpage). According to an exemplary embodiment of the present inventive concept, when the first semiconductor chip stack ST1 and the second semiconductor chip stack are respectively disposed in lower and upper portions of the semiconductor package 1000, the semiconductor package 1000 may have more quantity of adhesive layers in the lower portion thereof than in the upper portion thereof. Therefore, semiconductor package 1000 may have greater shrinkage at the lower portion thereof than at the upper portion thereof, and accordingly the smile warpage may be prevented.

Figure 2A:
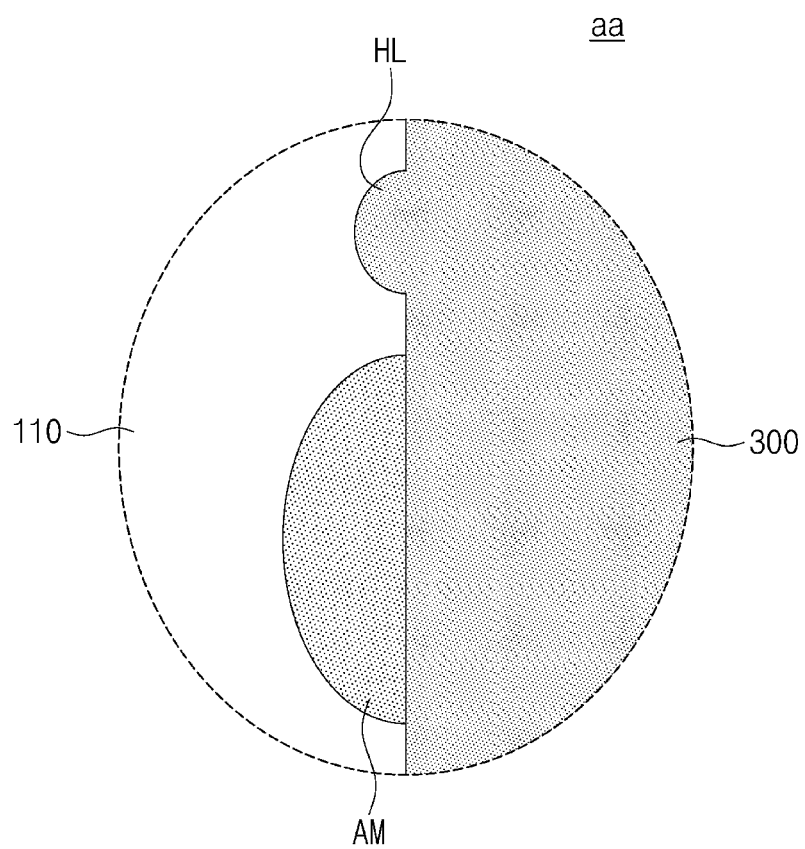
FIG. 2A is an enlarged view illustrating section aa of FIG. 1B according to an exemplary embodiment of the present inventive concept.
Figure 2B:
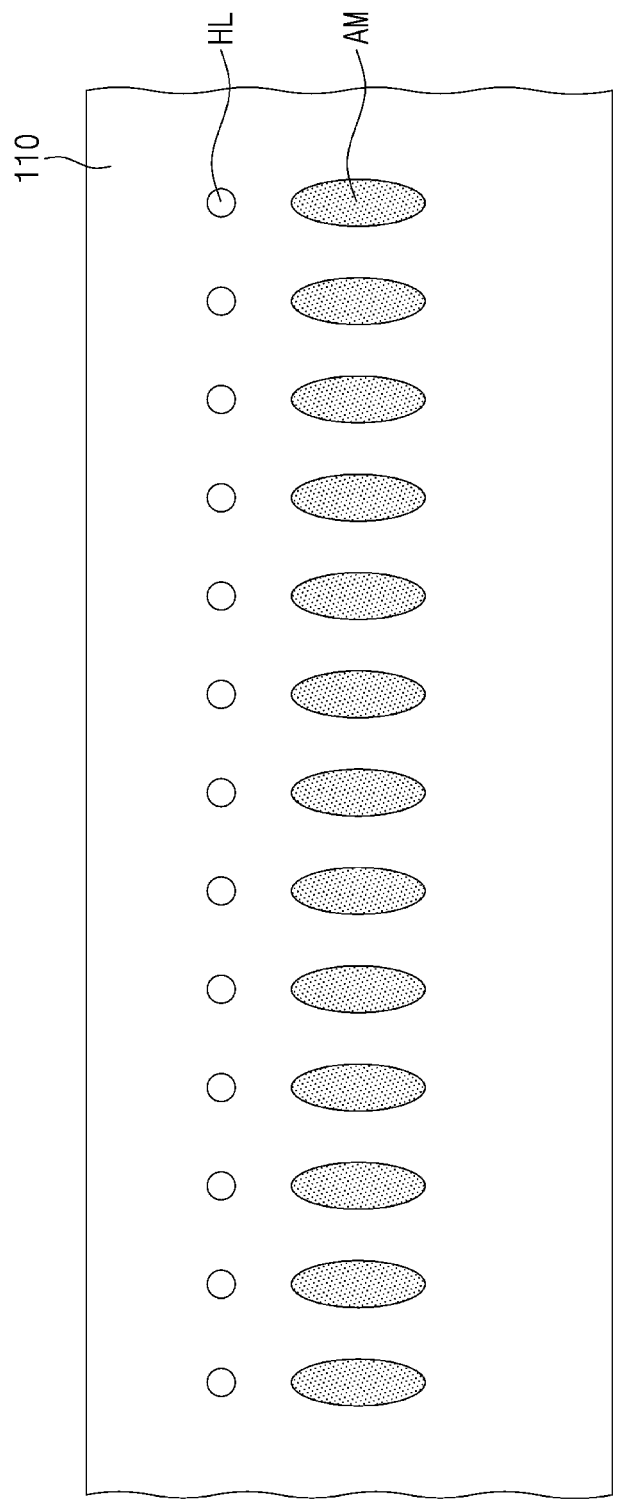
FIG. 2B is a simplified side view illustrating a lateral surface of a first semiconductor substrate according to an exemplary embodiment of the present inventive concept.

FIG. 2A is an enlarged view illustrating section aa of FIG. 1B according to an exemplary embodiment of the present inventive concept. FIG. 2B is a simplified side view illustrating the lateral surface of the first semiconductor substrate 110 according to an exemplary embodiment of the present inventive concept.

Referring to FIGS. 2A and 2B, a plurality of amorphous regions AM may be formed on opposite lateral surfaces of the first semiconductor substrate 110. The amorphous regions AM may be formed on a central portion of the lateral surface of the first semiconductor substrate 110. The amorphous regions AM may be formed along a line along which a laser travels in a stealth sawing process which will be discussed below. Each of the amorphous regions AM may have, for example, an oval shape. However, the present inventive concept is not limited thereto.

The concave portion HL may be formed on a location adjacent to the amorphous region AM. The concave portion HL may be a region that corresponds to a portion of a void formed in a stealth sawing process which will be discussed below.

Figure 3:
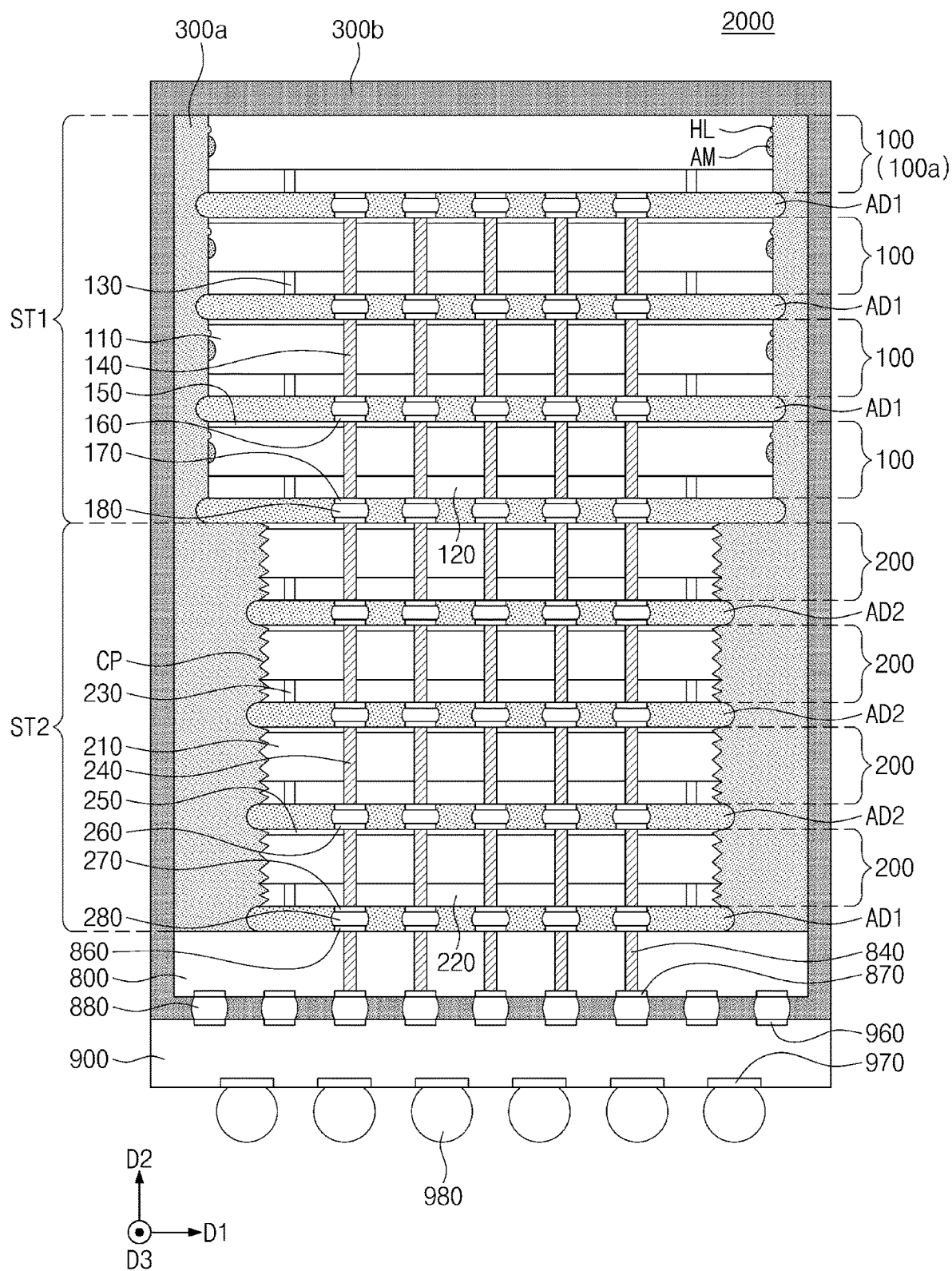
FIG. 3 is a cross-sectional view illustrating a semiconductor package according to an exemplary embodiment of the present inventive concept.

FIG. 3 is a cross-sectional view illustrating a semiconductor package 2000 according to an exemplary embodiment of the present inventive concept. Descriptions of the same elements previously discussed with reference to FIGS. 1A and 1B will be omitted for brevity.

Referring to FIG. 3, the semiconductor package 2000 may include the base chip 800, the second semiconductor chip stack ST2, and the first semiconductor chip stack ST1 that are sequentially stacked in the second direction (e.g., the D2 direction).

The first molding member 300a may be provided on the base chip 800 partially covering the top surface of the base chip 800. The first molding member 300a may cover the lateral surface of the second semiconductor chip stack ST2. The first molding member 300a may cover the lateral surface of the first semiconductor chip stack ST1.

A first semiconductor chip 100a positioned as an uppermost first semiconductor chip 100 of the first semiconductor chip stack ST1 may include none of the first through electrode 140, the first dielectric layer 150, and the first upper connection pad 160.

The total weight of the plurality of first adhesive layers AD1 provided in an upper portion of the semiconductor package 2000 may be greater than the total weight of the plurality of second adhesive layers AD2 provided in a lower portion of the semiconductor package 2000.

The semiconductor package 2000 may be mounted on the package substrate 900.

When the semiconductor package 2000 is mounted on the package substrate 900, the semiconductor package 2000 may warp in a concave shape (so-called crying warpage). According to an exemplary embodiment of the present inventive concept, when the first semiconductor chip stack ST1 and the second semiconductor chip stack ST2 are respectively disposed in the upper portion and the lower portion of the semiconductor package 2000, the semiconductor package 2000 may have more adhesive layers in the upper portion thereof than in the lower portion thereof. Therefore, the semiconductor package 2000 may have greater shrinkage at the upper portion thereof than at the lower portion thereof, and accordingly the crying warpage may be prevented.

Figure 4A:
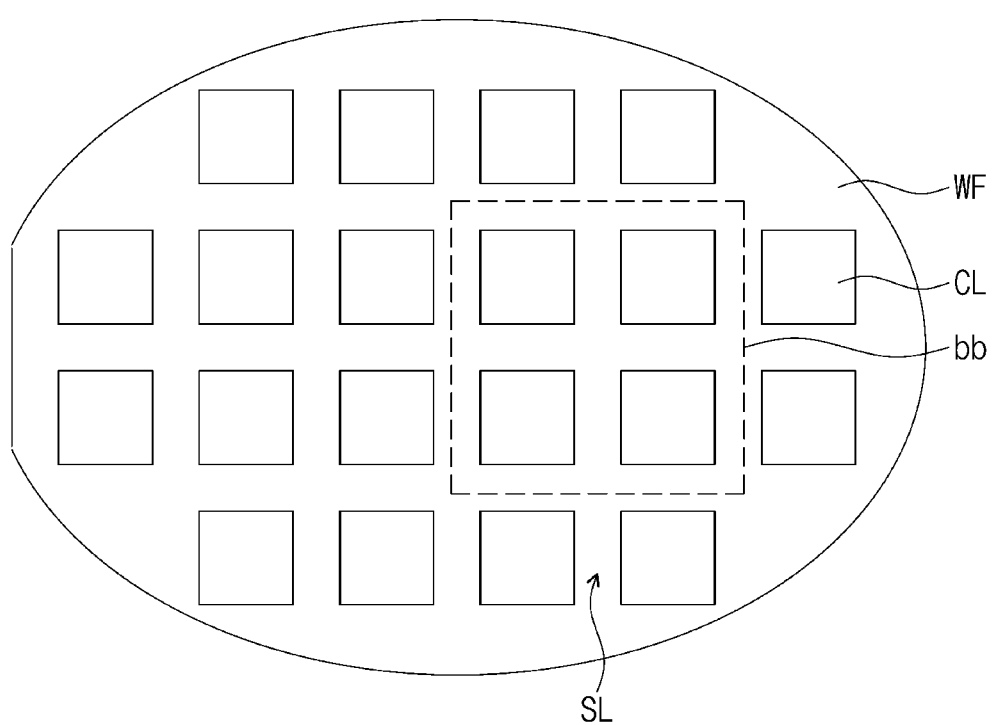
FIG. 4A is a plan view illustrating a wafer prior to sawing according to an exemplary embodiment of the present inventive concept.
Figure 4B:
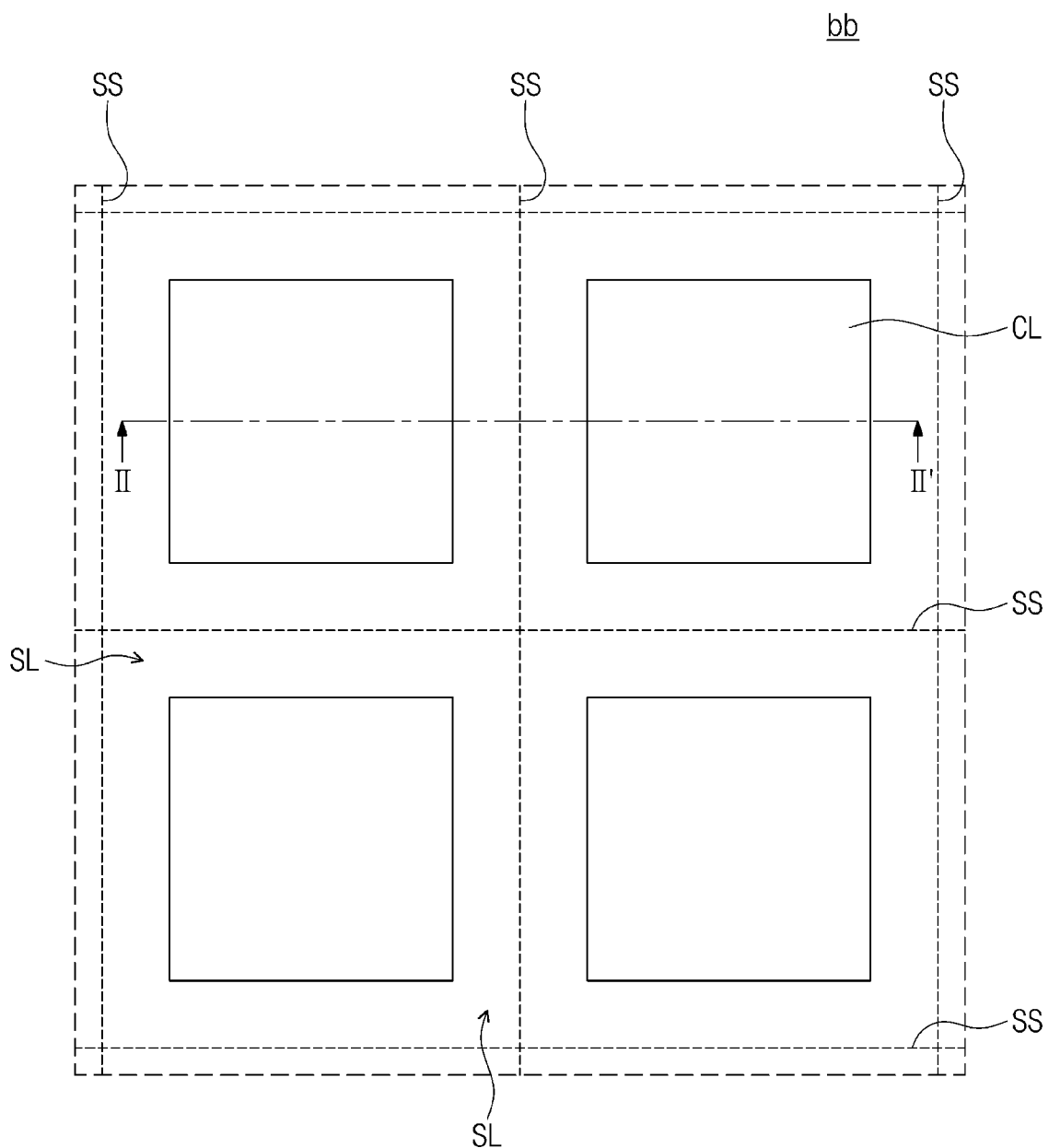
FIG. 4B is an enlarged view illustrating section bb of FIG. 4A according to an exemplary embodiment of the present inventive concept.
Figure 4C:
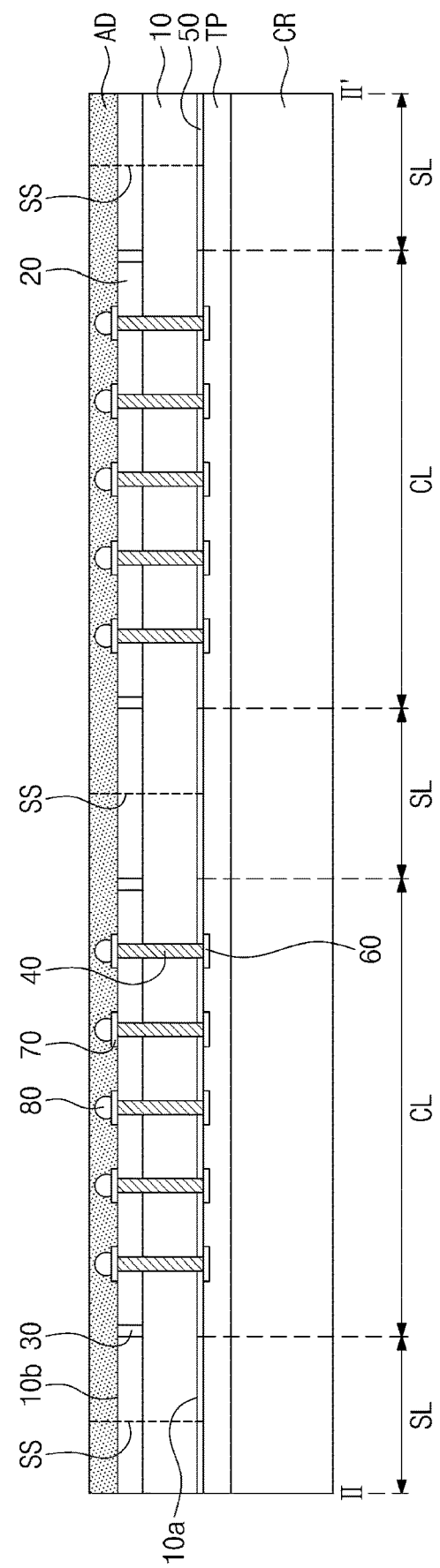
FIG. 4C is a cross-sectional view illustrating a cross-section taken along line II-II' of FIG. 4B according to an exemplary embodiment of the present inventive concept.

FIG. 4A is a plan view illustrating a wafer prior to sawing according to an exemplary embodiment of the present inventive concept. FIG. 4B is an enlarged view illustrating section bb of FIG. 4A according to an exemplary embodiment of the present inventive concept. FIG. 4C is a cross-sectional view taken along line II-II' of FIG. 4B according to an exemplary embodiment of the present inventive concept. For clarity of illustration, FIGS. 4A and 4B omit some components shown in FIG. 4C.

Referring to FIGS. 4A, 4B, and 4C, a wafer WF may be provided which includes a plurality of cell regions CL that are separated by a scribe lane SL. The wafer WF may be provided on a carrier substrate CR through a tape TP.

The scribe lane SL may include a region along which a saw line SS runs. The saw line SS may be an imaginary line. The wafer WF may be cut along the saw line SS in stealth and blade sawing processes which will be discussed below.

The wafer WF not yet cut may include a semiconductor substrate 10, a plurality of through electrodes 40, a dielectric layer 50, a plurality of first pads 60, a plurality of second pads 70, and a plurality of connection bumps 80. An adhesive layer AD may be provided on one surface of the wafer WF (e.g., the second surface 10b of the semiconductor substrate 110). The adhesive layer AD may include, for example, a non-conductive film (NCF).

The semiconductor substrate 10 may have a first surface 10a and a second surface 10b that face each other (e.g., are opposite to one another). The dielectric layer 50 may be provided on the first surface 10a of the semiconductor substrate 10. Each of the through electrodes 40 may penetrate the semiconductor substrate 10 and may extend from a bottom surface of the dielectric layer 50 toward the second surface 10b of the semiconductor substrate 10. The first pads 60 may face corresponding second pads 70. The through electrodes 40 may be electrically connected to corresponding first pads 60 and corresponding second pads 70. The first pads 60 may be provided on the dielectric layer 50, and the second pads 70 may be provided on the second surface 10b of the semiconductor substrate 10.

The semiconductor substrate 10 may include the cell region CL and the scribe lane SL that surrounds the cell region CL. A circuit layer 20 may be provided on the cell region CL. A protective ring 30 may be provided in the vicinity of an edge of the circuit layer 20.

Figure 5A:
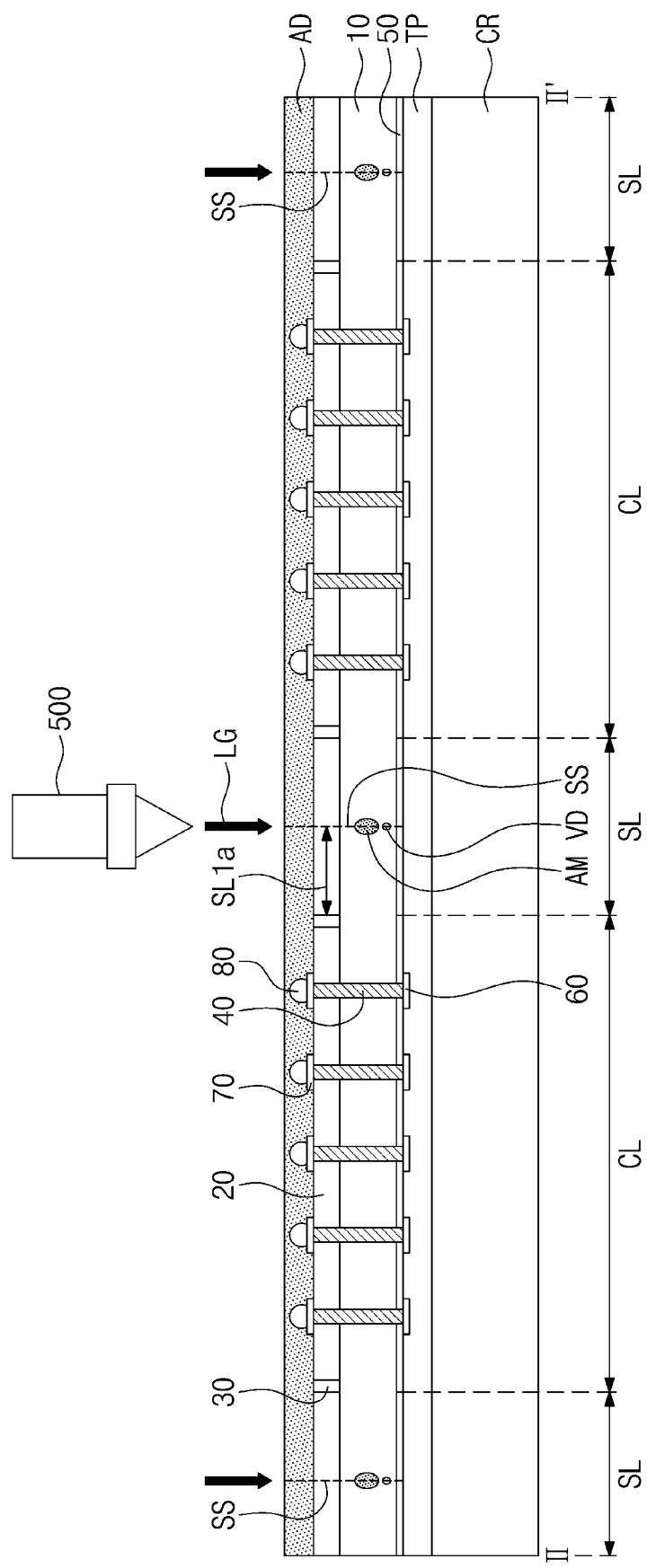
FIGS. 5A and 5B are cross-sectional views illustrating steps in a method of fabricating a first semiconductor chip according to an exemplary embodiment of the present inventive concept.
Figure 5B:
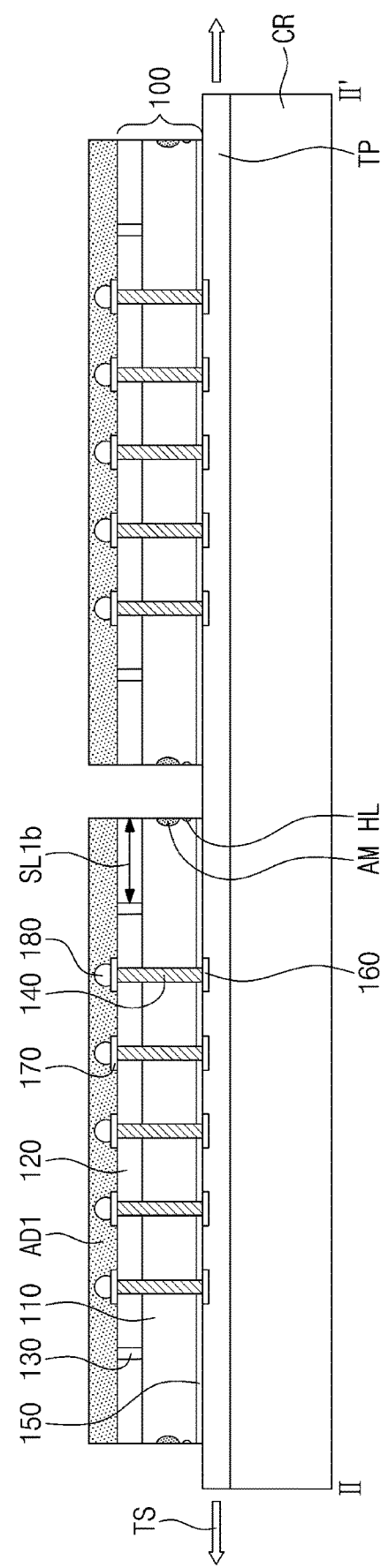

FIGS. 5A and 5B are cross-sectional views illustrating a method of fabricating a first semiconductor chip according to an exemplary embodiment of the present inventive concept.

Referring to FIGS. 4B and 5A, a stealth sawing process may be performed on the wafer WF. A laser tool 500 may irradiate the scribe lane SL with a laser LG. For example, the saw line SS may be irradiated with the laser LG to locally heat the semiconductor substrate 10. Crystal structures of heated regions of the semiconductor substrate 10 may be changed to form the amorphous regions AM. A void VD may be formed at a location adjacent to each of the amorphous regions AM. A high-density dislocation may be created around the amorphous region AM.

Referring to FIG. 5B, the tape TP may stretch in the direction designated by a symbol TS. The stretch of the tape TP may cause a crack to propagate from the amorphous region AM. The amorphous region AM may act as a crack seed. The crack may propagate from the semiconductor substrate 10 toward other regions. The crack may divide the semiconductor substrate 10 into a plurality of first semiconductor chips 100 and a plurality of first adhesive layers AD1. The amorphous region AM and the concave portion HL that is a portion of the void VD may be found on the lateral surface of each of the first semiconductor chips 100.

In comparison with FIG. 5A, an area of a scribe lane SL1b that remains on the first semiconductor chip 100 after the stealth sawing process may be substantially the same as an area of a scribe lane SL1a between the saw line SS and the cell region CL before the stealth sawing process.

Figure 6B:
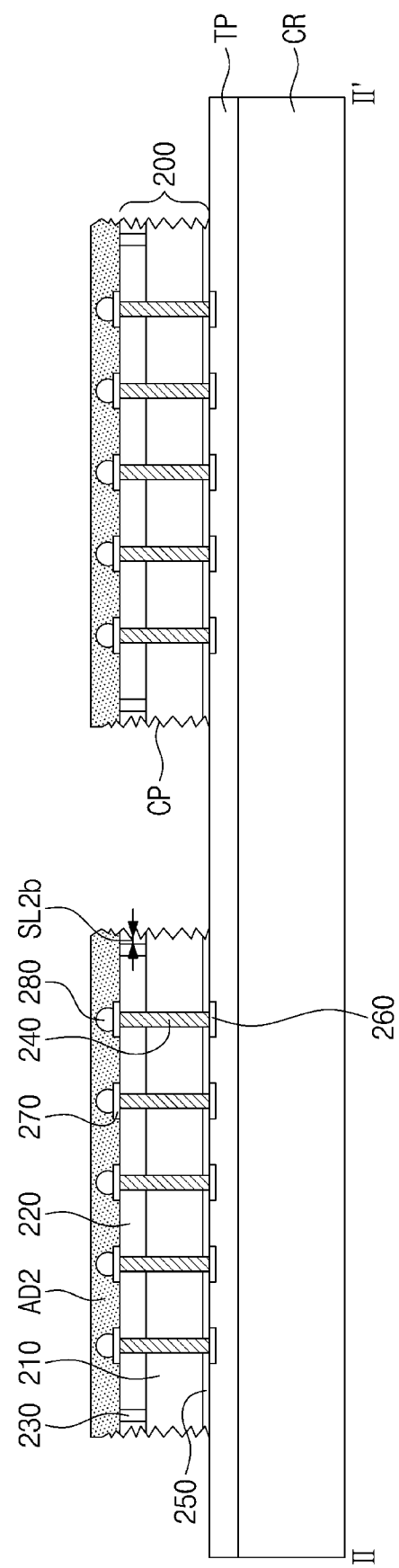

FIGS. 6A and 6B are cross-sectional views illustrating a method of fabricating a second semiconductor chip according to an exemplary embodiment of the present inventive concept.

Referring to FIGS. 4B and 6A, a blade sawing process may be performed on the wafer WF. A rotational blade BD may cut the scribe lane SL. For example, the rotational blade BD may move along the saw line SS.

Because the rotational blade BD has its thickness and friction is generated during the cutting, the wafer WF may suffer from loss of a portion that corresponds to the scribe lane SL during the sawing procedure. The semiconductor substrate 10 may have a rough surface on its portion in direct contact with the rotational blade BD.

Referring to FIG. 6B, the blade sawing process on the wafer WF may form a plurality of second semiconductor chips 200 and a plurality of second adhesive layers AD2. The chipping region CP may be found on at least a portion of the lateral surface of each of the second semiconductor chips 200.

In comparison with FIG. 6A, an area of a scribe lane SL2b that remains on the first semiconductor chip 100 after the blade sawing process may be less than an area of a scribe lane SL2a between the saw line SS and the cell region CL before the blade sawing process.

Referring to FIGS. 1A, 5B, and 6B, the first semiconductor chips 100 to which the first adhesive layers AD1 are attached may be stacked on a base substrate, thereby forming the first semiconductor chip stack ST1. The second semiconductor chips 200 to which the second adhesive layers AD2 are attached may be stacked on the first semiconductor chip stack ST1, thereby forming the second semiconductor chip stack ST2.

Afterwards, a first molding layer may be formed to cover the base substrate, the first semiconductor chip stack ST1, and the second semiconductor chip stack ST2. The base substrate and the first molding layer may experience a singulation process to form the base chip 800 and the first molding member 300a. The singulation process may also form the semiconductor package 1000.

Additionally, the semiconductor package 1000 may be mounted on the package substrate 900. A second molding layer may be formed to cover the semiconductor package 1000 and the package substrate 900. Thereafter, the second molding layer may experience a singulation process to form the second molding member 300b.

According to exemplary embodiments of the present inventive concept, a semiconductor package may include semiconductor chips whose sizes are different, which may result in a reduction in warpage.

Although the present inventive concept has been described in connection with the exemplary embodiments thereof, it will be understood by one of ordinary skill in the art that variations in form and detail may be made therein without departing from the spirit and scope of the present inventive concepts. The above disclosed exemplary embodiments of the present inventive concept should thus be considered illustrative and not restrictive.

What is claimed is:

1. A semiconductor package, comprising:
a first semiconductor chip stack and a second semiconductor chip stack that are adjacent to each other,
wherein the first semiconductor chip stack includes a plurality of first semiconductor chips and a plurality of first adhesive layers,
wherein the second semiconductor chip stack includes a plurality of second semiconductor chips and a plurality of second adhesive layers,
wherein each of the first semiconductor chips includes a first cell region and a first scribe lane that has a rectangular annulus shape that surrounds the first cell region,
wherein each of the second semiconductor chips includes a second cell region and a second scribe lane that has a rectangular annulus shape that surrounds the second cell region,
wherein an area of the first scribe lane is greater than an area of the second scribe lane,
wherein the plurality of first adhesive layers and the plurality of second adhesive layers have the same coefficient of thermal expansion,
wherein each of the first semiconductor chips includes a first protective ring disposed between the first scribe lane and the first cell region,
wherein each of the second semiconductor chips includes a second protective ring disposed between the second scribe lane and the second cell region, and
wherein a spacing distance between the first protective ring and an adjacent lateral surface of each of the first semiconductor chips is greater than a spacing distance between the second protective ring and an adjacent lateral surface of each of the second semiconductor chips.

2. The semiconductor package of claim 1, wherein
each of the first semiconductor chips has a first width,
wherein each of the second semiconductor chips has a second width; and
wherein the first width of each of the first semiconductor chips is greater than the second width of each of the second semiconductor chips.

3. The semiconductor package of claim 1, wherein, a spacing distance between at least one side of each of the first semiconductor chips and an adjacent side of each of the second semiconductor chips is in a range of 15 μm to 25 μm.

4. The semiconductor package of claim 1, wherein, when viewed in a plan view, a portion of the first scribe lane overlaps the second scribe lane.

5. The semiconductor package of claim 1, wherein, the first scribe lane at least partially surrounds the second scribe lane.

6. The semiconductor package of claim 1, wherein
an area of the first cell region is the same as an area of the second cell region, and
wherein the first cell region vertically overlaps the second cell region.

7. The semiconductor package of claim 1, wherein the first semiconductors chip includes an amorphous region that is formed within a semiconductor substrate of the first semiconductor chip, on a lateral surface thereof.

8. The semiconductor package of claim 1, wherein each of the first adhesive layers and each of the second adhesive layers includes a non-conductive film (NCF).

9. The semiconductor package of claim 1, wherein a central portion of a lateral surface of each of the first semiconductor chips has a dislocation density greater than a dislocation density at an edge of the lateral surface of each of the first semiconductor chips.

10. The semiconductor package of claim 1, wherein an upper portion and a lower portion of a lateral surface of each of the first semiconductor chips has a dislocation density greater than a dislocation density at a central portion of a lateral surface of each of the second semiconductor chips.

11. A semiconductor package, comprising:
a first semiconductor chip stack and a second semiconductor chip stack that are adjacent to each other,
wherein the first semiconductor chip stack includes a plurality of first semiconductor chips and a plurality of first adhesive layers,
wherein the second semiconductor chip stack includes a plurality of second semiconductor chips and a plurality of second adhesive layers,
wherein each of the first semiconductor chips includes a first cell region and a first scribe lane that has a rectangular annulus shape that surrounds the first cell region,
wherein each of the second semiconductor chips includes a second cell region and a second scribe lane that has a rectangular annulus shape that surrounds the second cell region,
wherein an area of the first scribe lane is greater than an area of the second scribe lane,
wherein the plurality of first adhesive layers and the plurality of second adhesive layers have the same coefficient of thermal expansion, and
wherein a surface roughness on a lateral surface of each of the second semiconductor chips is greater than a surface roughness on a lateral surface of each of the first semiconductor chips.

12. A semiconductor package, comprising:
a base chip;
a first semiconductor chip stack and a second semiconductor chip stack that are stacked in a vertical direction on the base chip; and
a molding member that at least partially covers the base chip, the first semiconductor chip stack, and the second semiconductor chip stack,
wherein the first semiconductor chip stack includes a plurality of first semiconductor chips that are stacked in the vertical direction and a plurality of first adhesive layers disposed on a bottom surface of each of the first semiconductor chips,
wherein the second semiconductor chip stack includes a plurality of second semiconductor chips that are stacked in the vertical direction and a plurality of second adhesive layers disposed on the bottom surface of each of the second semiconductor chips,
wherein each of the first semiconductor chips and each of the second semiconductor chips has a width in a first direction,
wherein the width in the first direction of each of the first semiconductor chips is greater than the width in the first direction of each of the second semiconductor chips, wherein the first semiconductor chip includes an amorphous semiconductor material that is formed within a semiconductor substrate of the first semiconductor chip, on a lateral surface thereof, wherein a surface roughness on a lateral surface of each of the second semiconductor chips is greater than a surface roughness on the lateral surface of each of the first semiconductor chips, and wherein the plurality of first adhesive layers and the plurality of second adhesive layers include the same adhesive material.

13. The semiconductor package of claim 12, wherein each of the first semiconductor chips and each of the second semiconductor chips is a memory chip, and wherein each of the first semiconductor chips and each of the second semiconductor chips include the same circuit device.

14. The semiconductor package of claim 12, wherein each of the first semiconductor chips is formed by stealth sawing, and wherein each of the second semiconductor chips is formed by blade sawing.

15. The semiconductor package of claim 12, wherein each of the first adhesive layers and each of the second adhesive layers has a width in the first direction, and wherein the width in the first direction of each of the first adhesive layers is greater than the width in the first direction of each of the second adhesive layers.

16. The semiconductor package of claim 12, wherein a weight of the plurality of first adhesive layers is greater than a weight of the plurality of second adhesive layers.

17. The semiconductor package of claim 12, further comprising:

a first pad disposed at the bottom surface of each of the first semiconductor chips; and a second pad disposed at the bottom of each of the second semiconductor chips, wherein, a distance between an edge of each of the first semiconductor chips and the first pad is greater than a distance between an edge of each of the second semiconductor chips and the second pad.

* * * * *